(12) United States Patent
Rapp

(10) Patent No.: US 7,947,214 B1
(45) Date of Patent: May 24, 2011

(54) PROCESS AND PRODUCT FOR MAKING CERAMIC MATERIALS FOR SEMICONDUCTOR DOPING

(76) Inventor: Jame E. Rapp, Oregon, OH (US)

( * ) Notice: Subject to any disclaimer, the term of this patent is extended or adjusted under 35 U.S.C. 154(b) by 942 days.

(21) Appl. No.: 11/254,103

(22) Filed: Oct. 19, 2005

Related U.S. Application Data

(60) Provisional application No. 60/625,359, filed on Nov. 6, 2004.

(51) Int. Cl.
*B28B 1/00* (2006.01)

(52) U.S. Cl. ...... 264/667; 264/666; 264/605; 252/521.4

(58) Field of Classification Search ............... 252/521.4; 264/605, 666, 667
See application file for complete search history.

(56) References Cited

U.S. PATENT DOCUMENTS

| | | | |
|---|---|---|---|
| 3,907,618 A | 9/1975 | Rapp | |
| 3,962,000 A | 6/1976 | Rapp | |
| 3,998,667 A | 12/1976 | Rapp | |
| 4,282,282 A | 8/1981 | Rapp | |
| 5,145,540 A * | 9/1992 | Foley et al. | 156/89.17 |
| 6,066,585 A * | 5/2000 | Swartz | 501/128 |
| 6,475,938 B1 * | 11/2002 | Budd | 501/5 |
| 2007/0128450 A1 * | 6/2007 | Mori et al. | 428/432 |
| 2007/0237935 A1 * | 10/2007 | Mori et al. | 428/210 |

FOREIGN PATENT DOCUMENTS

WO    WO 01/10788    * 12/2001

* cited by examiner

*Primary Examiner* — Matthew J Daniels
*Assistant Examiner* — Russell J Kemmerle, III

(57) ABSTRACT

This process is a fused glass powder process for making ceramic billets for semiconductor dopants. The powder process uses a unique combination of steps for packing, compacting and heat treating the powders. The resulting billets may be tailored in composition to provide a variety of densities, rigidities and $B_2O_3$ evolution rates. Further, the resulting wafers have a large diameter to meet the needs of semiconductor production.

17 Claims, No Drawings

PROCESS AND PRODUCT FOR MAKING CERAMIC MATERIALS FOR SEMICONDUCTOR DOPING

CROSS-REFERENCE

This application claims the benefit of provisional patent application Ser. No. 60/625,359 filed Nov. 6, 2004.

TECHNICAL FIELD

The process of this invention uses a unique combination of steps to produce glass ceramic billets for use in making semiconductor dopant sources. The resulting billets may be tailored to provide a variety of desirable properties including $B_2O_3$ evolution rates.

BACKGROUND OF THE INVENTION

This invention is an improvement over the method used in making glass-ceramics for semiconductor doping as described in U.S. Pat. Nos. 3,907,618, 3,962,000, 3,998,667 and 4,282,282. The disclosure of these patents is herein incorporated by reference. These patents describe a material and a method to make a glass-ceramic material by first melting a special glass composition at a high temperature, casting it into a round billet, cooling it to room temperature and then partially crystallizing the glass by passing the glass billet through a heat treatment cycle. The treated billets are then turned round and cut into thin wafers for use as planar diffusion sources for doping silicon wafers in semiconductor production. In addition, U.S. Pat. No. 5,145,540 describes a CIP process for sintering powders to make ceramic bodies. The method combines 40-90% oxides and 10-60% of a glass powder. The process of this invention differs in that billets are made of glass powders containing up to about 10% oxide additions.

In planar diffusion doping, a planar (i.e., flat) surface of a solid dopant host and a planar surface of a silicon wafer to be doped are positioned close and parallel to each other during the diffusion cycle. The ceramic wafer evolves $B_2O_3$ which deposits on the silicon wafer during the diffusion cycle. The $B_2O_3$ then reduces to boron which in turn diffuses into the silicon wafer to create a semiconductor device.

The above four US patents give many compositions from the $RO$—$Al_2O_3$-$B_2O_3$-$SiO_2$ system were RO is one or more alkaline earth oxides (BaO), MgO, etc.). The compositions that can be melted, cast into billets, cooled to a relatively low temperature or to room temperature, and then passed through a heat treatment cycle to partially crystallize the glass in a controlled manner into what is known as a glass-ceramic. A major criteria for the glass-ceramic process is to select a composition that does not devitrify (uncontrolled crystallization) when it is cast into billets and is cooled. If any uncontrolled crystallization occurs, the final billet will contain relatively large crystals that can cause problems in semiconductor processing. These problems can include trapping impurities during cutting of the planar diffusion sources which evolve during use or can include breaking of the source during use because of stresses concentrating at the crystal. The larger the diameter of the billet to be cast, the more difficult it is to cool the glass billet without devitrication. It is therefore becoming very difficult to meet the demands of the semiconductor industry for large diameter planar diffusion source using the glass-ceramic process. These problems are overcome using the "fused glass powder" process of this invention.

It is possible to adjust the glass compositions so that large diameter glass billets can be cast and cooled to room temperature without devitrification. However, these more stable compositions do not produce planar diffusion sources that are rigid enough when the billets are heat treated and cut into planar diffusion sources for use in semiconductor doping. These planar diffusion sources quickly warp during use making them unusable. My "fused glass powder" process overcomes these problems.

SUMMARY OF THE INVENTION

This invention is a method to produce ceramic billets of a variety of shapes and sizes from powders made from a variety of glass compositions by fusing the powders together into a dense ceramic billet using a heat treatment cycle. The powders may be made from melted glass. The powders may be made from melted glass poured between rollers to make ribbon or poured into water to make cullet for ball milling. Water-quenched cullet grinds differently from ribbon quenched between water-cooled rollers. Powder from either method, however, has been found to work well in this invention. Preferred glass compositions are selected from the following components:

| Components | Mole % |
| --- | --- |
| $SiO_2$ | 40-60 |
| $Al_2O_3$ | 10-30 |
| $B_2O_3$ | 15-45 |
| BaO | 1-15 |
| RO | 3-20 |

Where RO is selected from BaO, MgO, CaO, SrO and mixtures thereof. Where the mole ratio $Al_2O_3/RO$=1.5-9.0.

More preferred are the glass compositions that are selected from the following components:

| Components | Mole % |
| --- | --- |
| $SiO_2$ | 35-55 |
| $Al_2O_3$ | 15-25 |
| $B_2O_3$ | 15-45 |
| BaO | 2-6 |
| MgO | 2-6 |

Where the mole ratio $Al_2O_3/(BaO+MgO)$=1.5-5.0.

The billets are made by heat treating glass powders and preferably are made by adding 0-4% water to glass powders as a binder. The ceramic materials of this invention should not be confused with glass ceramics. "Glass-ceramics" has a special meaning. The melt is cast as a glass. The glass is then heat treated and crystallized in a controlled manner.

Prior to heat treatment, the powdered glass is made into a billet using one of the following methods:
1. Putting loosely packing glass powders in a ceramic crucible and heat treating the powder.
2. Isostatic pressing the powders and heat treating the pressed powder.
3. Axial pressing the powders in a ring and piston mold. Heat treating the pressed powder follows this step.

The powders may be made from more than one composition. The different compositions may be located in the billet so as to produce different $B_2O_3$ evolution rates at different positions across the diameter of a wafer cut from the billet. The powders of the different compositions and up to 10% of stable oxides such as $Al_2O_3$ or $SiO_2$ are blended to produce sintered materials that have different properties than any of the individual compositions.

The heat treatment cycle has a low fusion temperature for initial sintering followed by a high sintering temperature for densifying the powder into a solid billet. Preferably, the heat treatment cycle has a low fusion temperature around 750° C.-850° C. and a high sintering temperature around 1000°-1200° C. One embodiment stacks the pressed billets in the heat treatment furnace so that they will stick together during the heat treatment cycle. The billets are cut into planar diffusion wafers for use in semiconductor production. The final application may include the following embodiments:

1. Concentric cylinder with one composition in the center and a different one on the outside.
2. Blended powders of two or three or more different compositions.
3. Blended powder of one or more compositions with up to 10% $Al_2O_3$, $SiO_2$ or other similar stable oxides as an additive.

Other objects and advantages of the present invention will become apparent to those skilled in the art upon a review of the following detailed description of the preferred embodiments and the accompanying drawings.

DETAILED DESCRIPTION OF THE INVENTION

The prior art provides for compositions that can be made into 3" diameter planar diffusion sources that have improved resistance to warpage over those disclosed in previous patents when cycled between 900° C. and 1050° C. The need for even larger diameter planar diffusion sources (now up to 6" in diameter and even larger) for use at temperatures at and above 1150° C. have made even these compositions difficult to manufacture into large glass billets without devitrification. The new "fused glass powder" process overcomes this problem. The glass melts must also be made very homogeneous when cast into glass billets in the glass-ceramic process of this invention. Otherwise, the cord (streaks of non-uniform glass) in the final planar diffusion sources may create problems with the sources (breakage) or with the manufacture of semiconductor devices. Since these $RO—B_2O_3—Al_2O_3—SiO_2$ compositions can dissolve many refractory crucibles (i.e., fused silica), it is difficult to eliminate the cord originating from the crucible when they are melted in refractory crucibles. Consequently, these melts are usually made in large platinum crucibles with platinum stirrers which, of course, are very expensive resulting in very high manufacturing costs.

The new "fused glass powder" process of this invention overcomes this problem and permits fused silica, alumina or similar refractory crucibles instead of platinum crucibles to be used for melting. This "fused glass powder" invention provides a method to make high quality large diameter billets for cutting into planar diffusion sources utilizing compositions that can be used with the glass-ceramic process. The invention also provides a method to make high quality large diameter billets with compositions that cannot be used with the glass-ceramic process because the glass billets might devitrify or partially devitrify during cooling. The invention also permits melting in silica, alumina or similar refractory crucibles which are much less expensive than platinum crucibles often used in the glass-ceramic process. The prior art provides for a wide range of compositions in the $BaO—MgO—B_2O_3—Al_2O_3—SiO_2$ system. The manufacture of planar diffusion sources utilizing the following examples illustrates how the new "fused glass powder" invention provides significant improvement and unexpected results over the prior method of manufacturing planar diffusion sources.

Example 1

In a specific example of the invention, the following composition was melted in a fused silica crucible at about 2900° F.

| Component | Mole % | wt % |
|---|---|---|
| $SiO_2$ | 46.3 | 37.0 |
| $Al_2O_3$ | 20.7 | 28.0 |
| MgO | 3.73 | 2.0 |
| BaO | 4.92 | 10.0 |
| $B_2O_3$ | 24.3 | 22.5 |
| $Cl_2$ | 0.5 | 0.5 |
| $Al_2O_3$/RO | 2.4 | |

This glass could also be melted in a platinum crucible, cast into billets and processed according normal procedures utilized in the glass-ceramic process. However, in this example, the glass was melted in a silica crucible and cast between water-cooled rollers to make ribbon. The ribbon was ball milled to make a powder having a screen fraction of about −80. The powder was then made into a billet using the technique described below. A technique to make the billet from this composition was to loosely pack the powder into a 2½ "diameter×2" high $Al_2O_3$ crucible having a thin layer of $Al_2O_3$ powder on the bottom. The $Al_2O_3$ powder insures that the ball milled powder will not stick to the crucible. The crucible filled with powder was placed in a heat treatment furnace and given the following heat treatment cycle:

Ramp from room temperature to 750° C.

Hold at 750° C. for about 16 hrs.

Ramp to 1150° C.

Hold 1150° C. for 2 hours.

Ramp to room temperature.

The "fused glass powder" billet pulled away from the walls of the $Al_2O_3$ crucible and was easily removed from the crucible. The "fused glass powder" billet was cut open and surprisingly was found to be very hard having the typical appearance of a billet made through the glass-ceramic process. Since the powder was not pressed, the material was much less dense than if it were made as a glass-ceramic material. This process permits a lighter dopant source to be made which is desirable and easier to handle by manufacturing personnel.

A wafer cut from this "fused glass powder" billet was then placed in the diffusion furnace and was used to periodically dope a silicon wafer for 1 hour in nitrogen at 1100° C. Four silicon wafers were doped over the hours that the source was held at 1100° C. The color of the deposited glass on the four doped silicon wafers was blue to yellow indicating a deposited $B_2O_3$ glass film thickness of about 1200 angstroms. This is about the thickness of the glassy film that is obtained from planar diffusion sources of this composition made with the glass-ceramic process. The sheet resistivity of the four doped silicon wafers was about 2.9 ohm/sq. This is also close to the sheet resistivity that is obtained from planar diffusion sources of this composition made with the glass-ceramic process. These results show that the material from the "fused glass powder" process evolves $B_2O_3$ at an acceptable rate for at least 105 hours at use temperatures near 1100° C.

Example 2

In a second specific example of the invention, the following composition was melted in a fused silica crucible at about 2900° F.:

| Component | Mole % | wt % |
| --- | --- | --- |
| $SiO_2$ | 48.3 | 38.6 |
| $Al_2O_3$ | 21.6 | 29.3 |
| MgO | 3.9 | 2.1 |
| BaO | 5.2 | 10.6 |
| $B_2O_3$ | 21.0 | 19.4 |
| $Al_2O_3$/RO | 2.4 | |

This glass could also be meted in a platinum crucible, cast into billets and processed according normal procedures utilized in the glass-ceramic process. However, this glass composition is much more difficult to make than the glass in Example 1 and is therefore more prone to devitrification. In this example, the glass was melted in a silica crucible and was cast between water-cooled rollers to make ribbon. The ribbon was ball milled to make a powder having a screen fraction of about −80. The powder was then made into billets using various techniques which includes the two examples below.

The first technique to make a billet with the powder from Example 2 was to add 4% deionized water to the powder and press the powder into two billets 1.5" diameter and 1" long in a Carver axial press with about 10,000 lbs pressure. The green strength of the pressed billets was good, the billets were hard, and they were easy to handle without crumbling. These billets were then placed on top of each other and heated to 750° C. for about 2 hours. When cooled to room temperature, surprisingly, the "fused glass powder" billets were hard and stuck together. This fusion is desirable because it is easier to cut a long billet into wafers on a ceramic saw than several small billets. The heat treating of the billets then continued with the following heat treatment cycle:

Ramp from room temperature to 750 C
Hold at 750 C for about 16 hrs
Ramp to 1065 C
Hold for 1 hr
Ramp to 1150 C
Hold at 1150 C for 2 hrs
Ramp to room temperature The "fused glass powder" billet was first held at 750 C for 16 hrs because this is the temperature where the powders initially stick together and the billet begins to shrink. The billets were held at 1065 C for one hour because a sample of this material that had been run in a dilatometer showed that significant shrinkage occurred near this temperature. Obviously, this is the temperature for this composition where the glass powders fuse together into a dense "fused glass powder" billet.

When the billets were removed from the heat treatment furnace, the "fused glass powder" billets were very hard, more dense than the billet obtained in Example 1 and stuck together. The inside of the "fused glass powder" billets, surprisingly, looked like a glass-ceramic billet that might have been made using the glass-ceramic method.

Example 3

The second technique to make a billet from the powder of Example 2 is to add 4% deionized water to the powder and cold isostatically press (CIP) the powder into a 4.5" diameter by 2" long billet at about 36,000 psi. The green billet was then heat treated according to the following heat treatment cycle:
Ramp from room temperature to 750° C. at about 1° C./min.
Hold at 750° C. for about 16 hrs.
Ramp to 1065° C. at about 1° C./min.
Hold for 1 hour.
Ramp to 1150° C. at about 0.5° C./min.
Hold 1150° C. for 2 hours.
Ramp to room temperature at about 0.5° C./min.

When the "fused glass powder" billet was removed from the heat treatment furnace, it was hard and more dense than the billet obtained from the first technique of example 2 and again resembled a billet that might have been made through the glass-ceramic route.

One skilled in the art might expect the powders of these examples to stick together when heat treated to a high temperature. However, it was unexpected to see the material to initially fuse together at a low temperature (near 750° C.) and then dramatically densify at a high temperature (1065-1150° C.) to such an extent that it resembles a source made through the conventional glass-ceramic route. It was also unexpected to observe the sources made through this "fused glass powder" process to dope silicon wafers similar to those made through the conventional glass-ceramic process, even though they exhibited different densities.

Other advantages of this "fused glass powder" process over the glass-ceramic process are as follows. The "fused glass powder" process would break up any cord in the glass originating from silica crucibles and uniformly disperse it throughout the powder during ball milling. This permits the use of fused silica or similar ceramic crucibles and eliminates the need for using expensive platinum crucibles.

Since the glass is rapidly quenched between rollers, the "fused glass powder" process permits very unstable and very rigid glasses containing $Al_2O_3$/RO mole ratios of over 3.0 to be made. Compositions having these higher $Al_2O_3$/RO mole ratios can be quenched into glass ribbon between rollers, ball milled into powders and made into "fused glass powder" billets according to the procedures outlined above. These compositions would produce planar diffusion sources that would exhibit even better warpage resistance during use at high temperatures than those shown in examples 1, 2 & 3.

In addition, the above described method of making "fused glass powder" billets also permits melting the glass in less expensive refractory crucibles for a much shorter melting time. The "fused glass powder" method of processing the glass permits making shapes other than round such as square planar diffusion sources for use in doping solar cell silicon. The "fused glass powder" method also permits combining more than one composition in a billet to obtain special $B_2O_3$ evolution rates at different positions such as the edges of the planar diffusion source. The "fused glass powder" method also permits inclusion of high purity Alumina and/or silica fibers to further increase its strength and resistance to warpage during use. The "fused glass powder" method also permits blending powders of different compositions or other oxides such as $Al_2O_3$, $SiO_2$ or other relatively stable oxides as solid particles or as bubbles to adjust properties such as resistance to warpage, density, $B_2O_3$ evolution rate, and the like.

In summary, the above "fused glass powder" process overcomes the shortcomings of the conventional glass-ceramic process and produces a planar diffusion source exhibits properties that are equivalent or better than those made by the glass-ceramic process. Very unstable compositions that cannot be made into large diameter billets using the glass-ceramic process can be made into very good billets using the "fused glass powder" billets. These billets will exhibit a hard material that can be cut into wafers which will exhibit superior warpage resistance. Almost any diameter or shape of planar diffusion sources can be made using the "fused glass powder" process with CIP, axial presses and/or even lose-packed crucibles.

The above detailed description of the present invention is given for explanatory purposes. It will be apparent to those skilled in the art that numerous changes and modifications can be made without departing from the scope of the invention. Accordingly, the whole of the foregoing description is to be construed in an illustrative and not a limitative sense, the scope of the invention being defined solely by the appended claims.

I claim:

1. A method to produce ceramic billets useful for semiconductor doping of a variety of shapes and sizes from powders made from a variety of ceramic compositions comprising the steps of:
   loosely packing ceramic powders into a preform; wherein the ceramic powders comprise 15 to 45 mole % $B_2O_3$;
   compacting the powder preform into a densely packed powder body with cold isostatic pressing;
   heating the densely packed powder body at a low fusion temperature ranging from 700° C. to 900° C. for initial sintering, and
   subsequently heating the powder body at a high sintering temperature ranging from 1000° C. to 1600° C. thereby further densifying the powders into a solid ceramic billet having a diameter greater than three inches useful for semiconducting doping.

2. A method according to claim 1 wherein the low fusion temperature ranges from 750° C. to 850° C.

3. A method according to claim 1 wherein the high sintering temperature ranges from 1000° C. to 1200° C.

4. A method according to claim 1 including the step of stacking a plurality of densely packed powder bodies together prior to the heating steps.

5. A method according to claim 1 including the step of packing a plurality of ceramic powders having different compositions into the preform.

6. A method according to claim 5 including the step of locating the compositions at different positions across the preform.

7. A method according to claim 5 including the step of blending the different compositions prior to packing.

8. A method according to claim 5 wherein the different composition have different $B_2O_3$ evolution rates.

9. A method according to claim 1 including the steps of adding up to 10% $Al_2O_3$, $SiO_2$, or other stable oxides as powders or as fibers to the composition.

10. A method according to claim 1 including the steps of adding up to 10% $Al_2O_3$, $SiO_2$, or other stable oxides as hollow spheres to the composition.

11. A method according to claim 1 including the step of making the powders from water-quenched cullet or from ribbon made by quenching melted glass between rollers.

12. A method according to claim 1 including the step of cutting the solid billet into planar diffusion wafers for use as a semiconductor dopant.

13. A method according to claim 1 including the step of forming the preform into a ring, a disc, a cylinder, or a square block.

14. A method according to claim 1 including the step of adding water to the powder as a binder for making the preform.

15. A method according to claim 1 wherein the ceramic compositions have the following components:

| Components | Mole % |
|---|---|
| $SiO_2$ | 40-60 |
| $Al_2O_3$ | 10-30 |
| $B_2O_3$ | 15-45 |
| BaO | 1-15 |
| RO | 3-20 |

Wherein RO is selected from BaO, MgO, CaO, SrO and mixtures thereof, wherein the mole ratio $Al_2O_3$/RO=1.5-9.0.

16. A method according to claim 1 wherein the ceramic composition have the following components:

| Components | Mole % |
|---|---|
| $SiO_2$ | 35-55 |
| $Al_2O_3$ | 15-25 |
| $B_2O_3$ | 15-45 |
| BaO | 2-6 |
| MgO | 2-6 |

Wherein the mole ratio $Al_2O_3$/(BaO+MgO)=1.5-5.0.

17. A method according to claim 1 wherein the billet has a diameter ranging from greater than three inches to six inches.

* * * * *